(12) United States Patent
Gaynor et al.

(10) Patent No.: US 6,816,032 B1
(45) Date of Patent: Nov. 9, 2004

(54) LAMINATED LOW-PROFILE DUAL FILTER MODULE FOR TELECOMMUNICATIONS DEVICES AND METHOD THEREFOR

(75) Inventors: Michael P. Gaynor, Chandler, AZ (US); Gary H. Shapiro, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/235,135

(22) Filed: Sep. 3, 2002

(51) Int. Cl.⁷ .............................. H01P 5/12; H03H 7/00; H03H 7/01
(52) U.S. Cl. ...................................... 333/175; 333/126
(58) Field of Search .................................. 333/175, 132, 333/133, 126, 101; 361/737, 752; 257/679, 275; 455/78

(56) References Cited

U.S. PATENT DOCUMENTS

| | | | |
|---|---|---|---|
| 4,532,419 A | | 7/1985 | Takeda |
| 4,905,124 A | | 2/1990 | Banjo et al. |
| 4,974,120 A | | 11/1990 | Kodai et al. |
| 5,574,309 A | | 11/1996 | Papapietro et al. |
| 5,742,479 A | | 4/1998 | Asakura |
| 5,784,259 A | | 7/1998 | Asakura |
| 5,815,804 A | * | 9/1998 | Newell et al. ................ 455/78 |
| 5,822,190 A | | 10/1998 | Iwasaki |
| 5,973,568 A | * | 10/1999 | Shapiro et al. .............. 330/295 |
| 6,040,622 A | | 3/2000 | Wallace |
| 6,075,995 A | * | 6/2000 | Jensen ...................... 455/552.1 |
| D445,096 S | | 7/2001 | Wallace |
| D446,525 S | | 8/2001 | Okamoto et al. |
| 6,384,688 B1 | * | 5/2002 | Fujioka et al. .............. 330/302 |
| 6,445,262 B1 | * | 9/2002 | Tanaka et al. ............... 333/133 |
| 6,586,786 B2 | * | 7/2003 | Kitazawa et al. ............ 257/275 |
| 6,600,385 B2 | * | 7/2003 | Harada et al. .............. 333/101 |
| 6,621,376 B2 | * | 9/2003 | Liu et al. .................... 333/126 |
| 6,625,470 B1 | * | 9/2003 | Fourtet et al. .............. 330/136 |
| 6,677,833 B2 | * | 1/2004 | Sheen ......................... 333/132 |
| 6,683,512 B2 | * | 1/2004 | Nakamata et al. .......... 333/126 |

FOREIGN PATENT DOCUMENTS

| | | | |
|---|---|---|---|
| JP | | 07017175 A | 1/1995 |
| JP | | 08190615 A | 7/1996 |
| JP | | 10-334205 | 12/1998 |

* cited by examiner

*Primary Examiner*—Patrick Wamsley
(74) *Attorney, Agent, or Firm*—Weiss, Moy & Harris, P.C.

(57) ABSTRACT

A laminated low-profile dual filter module for telecommunications devices and method provides both Groupe Spécial Mobile (GSM) and Digital Cellular System (DCS) transmit filters in a small package. The filter module comprises multiple layers of ceramic substrate with metal circuit patterns sandwiched between. Two separate filters are implemented within the layers, with a first filter comprising a first set of layers and the second filter adjoining within a second set of layers. Resonators for each filter are positioned at the opposite sides of the module, in order to avoid coupling between the resonators and ground layers are interspersed for isolation. Capacitors are implemented by a first plate defined by an area on one metal layer with the adjacent layers providing ground planes that form the second plate.

23 Claims, 7 Drawing Sheets

DCS FILTER TRANSMISSION LOSS 40

DCS FILTER RETURN LOSS 42

GSM FILTER TRANSMISSION LOSS 44

GSM FILTER RETURN LOSS 46

LAMINATED LOW-PROFILE DUAL FILTER MODULE FOR TELECOMMUNICATIONS DEVICES AND METHOD THEREFOR

FIELD OF THE INVENTION

The present invention relates generally to radio-frequency (RF) and microwave filters and more specifically for a dual RF filter having a small package size for integration within telecommunications devices.

BACKGROUND OF THE INVENTION

RF and microwave filters are used in telecommunications devices to reject out-of-band signals, filter undesired harmonics and spurious components from signals prior to transmission and for performing various other functions within the telecommunications devices.

In particular, a Groupe Spécial Mobile. (GSM) filter is typically required in the output of the transmitter for GSM transceivers and a Digital Cellular System (DCS) filter is typically required in the output of the transmitter for DCS transceivers. Both are typically required for a dual-mode telecommunications transceiver. Similar filters are also needed in wireless local area network (LAN) and wireless personal area network (WPAN) devices, such as BLUE-TOOTH and 802.11 devices. The above-mentioned filters occupy a significant amount of circuit board area and package volume within a dual-mode transceiver.

Small size and light weight components are critical to reducing the size of telecommunications transceivers and the trend is toward progressively smaller devices. Therefore, it would be desirable to reduce the size of required filters within telecommunications transceivers and further desirable to provide such reduction in a dual-mode telecommunications receiver wherein both a GSM and a DCS filter are required.

SUMMARY OF THE INVENTION

The above objectives of reducing filter size and providing a GSM and DCS filter that required less package volume and circuit board area are provided in a low-profile dual filter module that integrates two RF filter in one low-profile package. The dual filter module includes a first and second filter section each formed by multiple dielectric layers with metal circuit patterns sandwiched in between. The construction provides isolation between two filters in the same small package.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
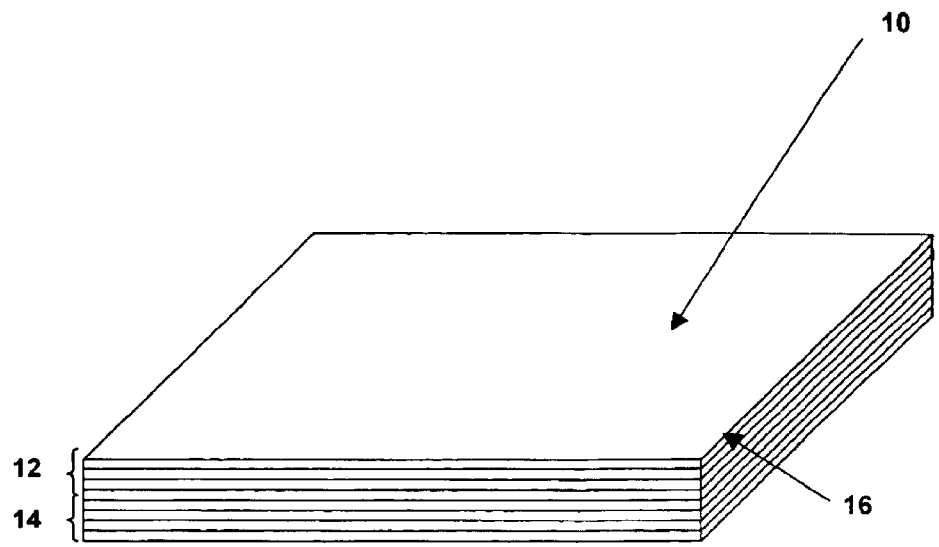
FIG. 1A is a pictorial diagram depicting a top projected view of a filter module in accordance with an embodiment of the present invention.

Referring now to the figures and in particular to FIG. 1A, a filter module 10, in accordance with an embodiment of the present invention is depicted. Filter module 10 includes a plurality of layers 16, each comprising a dielectric with metal circuit patterns that may be etched, sputtered or separately formed (stamped or die cut) between the dielectric layers. Layers 16 can be made of varying thickness and dielectric constant in order to achieve a particular capacitance for a given surface area. Capacitors within filter 10 are implemented with two ground plates opposing a central plate in order to achieve a higher capacitance value than with a single plate design. However, an alternative embodiment of the invention, one or both filters are implemented using a series capacitor and shunt inductors, wherein neither plate of the capacitor is connected to ground.

The layers in exemplary filter 10 are formed from a ceramic tape that is generally available for low temperature co-fired ceramic (LTCC) fabrication. The metal patterns are formed on each of layers 16, then layers 16 are compressed together and fused in a low-temperature bonding process. Terminals on an external surface of filter module 10 are plated for subsequent attachment to external circuits.

Within the layers, circuits are formed by the metal patterns that achieve inductors, capacitors and inductive coupler stages, as well as shield planes for preventing coupling between the filter stages, between components within the filter stages and between the filters and the outside environment.

Figure 1B:
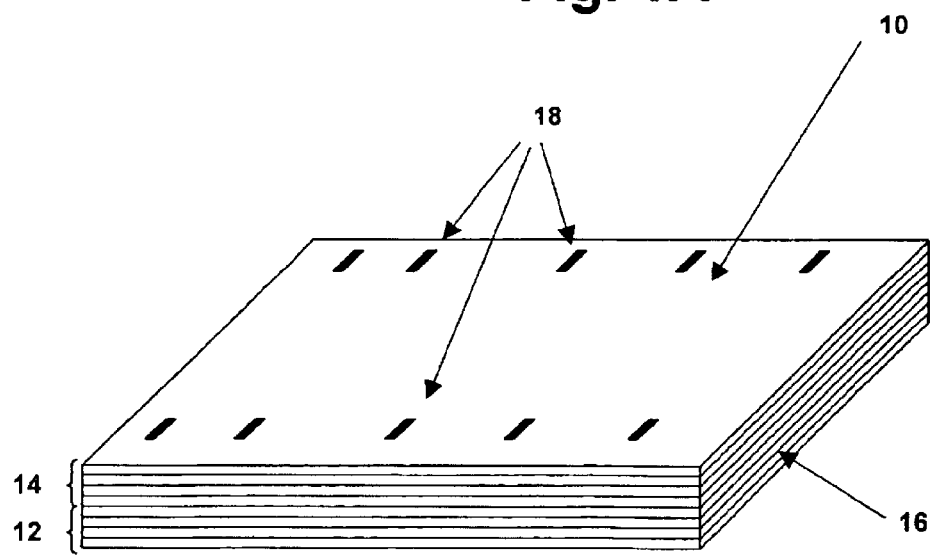
FIG. 1B is a pictorial diagram depicting a bottom projected view of the filter module of FIG. 1A.

Filter module 10 is a dual filter module having a first section 12 formed from a first set of layers from among the plurality of layers 16 and a second set of layers 14. Referring now to FIG. 1B, a set of terminals 18 are disposed on the bottom side of filter 10 for connection to external circuits.

In the exemplary-embodiment, filter module comprises a Groupe Spécial Mobile (GSM) filter and a Digital Cellular System (DCS) filter having separate terminals 18 for connection to GSM and DCS circuits within an assembly. The circuit assembly is desirably a very thin circuit module having a thickness on the order of 1 millimeter, and as such, present off-the-shelf filters are either too thick, or require a large amount of circuit module area.

The present invention provides a dual filter module 10 that incorporates two filters within a single stack of layers 16, while effectively isolating the filters from each other and achieving a similar level of performance as two currently available single filter modules.

Figure 2A:
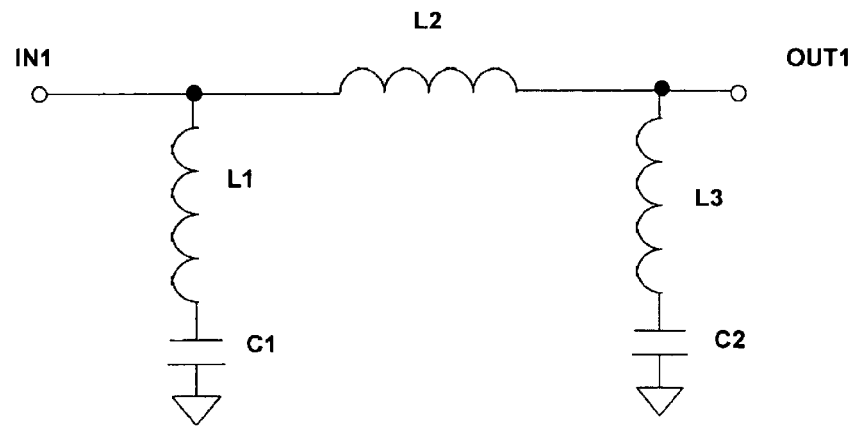
FIG. 2A is a schematic diagram of a first filter section as embodied within the filter module of FIGS. 1A and 1B.

Referring now to FIG. 2A, a schematic diagram of a first (DCS) low-pass filter section is depicted. Inductor L1 and capacitor C1 form a first resonant circuit that can be viewed as a resonator or as a lumped-parameter LC circuit. Inductor L3 and capacitor C2 form a second resonant circuit. Inductor L2 provides coupling between these two resonant circuits as well as part of the filtering function. The first resonant circuit (L1, C1) and the second resonant circuit (L3,C2) are positioned at opposite corners of their respective layers 16 within filter module 10, providing isolation that enhances the performance of filter module 10.

Figure 2B:
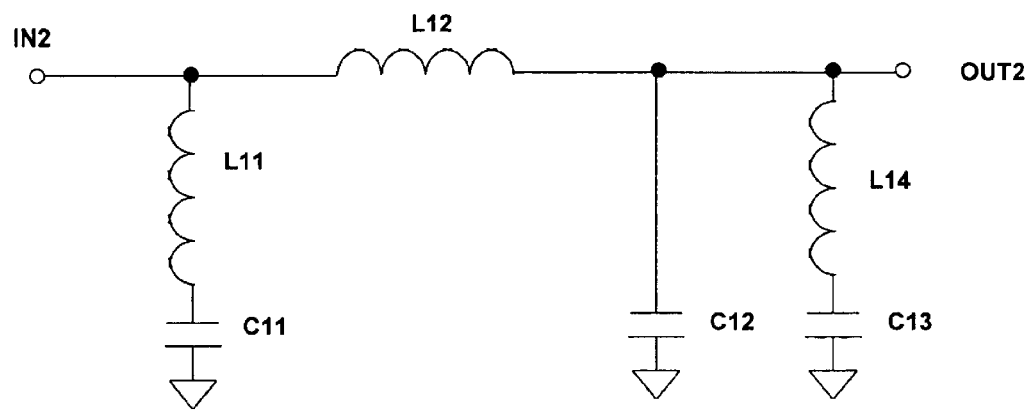
FIG. 2B is a schematic diagram of a second filter section as embodied within the filter module of FIGS. 1A and 1B.

Referring now to FIG. 2B, a schematic diagram of a second (GSM) low-pass filter section is depicted. Inductor L11 and capacitor C11 form a first resonant circuit that can be viewed as a resonator or as a lumped-parameter LC circuit. Inductor L14 and capacitor C13 form a second resonant circuit while capacitor C12 adds to the filtering function. Inductor L12 provides coupling between these resonant circuits as well as part of the filtering function. The first resonant circuit (L11, C11) and the second resonant circuit (L14, C13) are positioned at opposite corners of their respective layers 16 within filter module 10, providing isolation that enhances the performance of filter module 10.

While the above illustrated filter sections within filter module 10 are both low-pass filters and are for dedicated bands, specific filter implementations should not be viewed as limiting the present invention. Combinations of high-pass, low-pass, band-pass and notch filters can all be achieved within the multiple filters of the present invention, and more than two filters may be stacked using the same techniques and structures. Further, bandpass filters may be formed by a cascade of a high-pass filter and a low-pass filter connected in series within filter module 10. In the above mentioned cascade configuration, filter module 10 need only include a single input and a single output terminal.

Figure 3A:
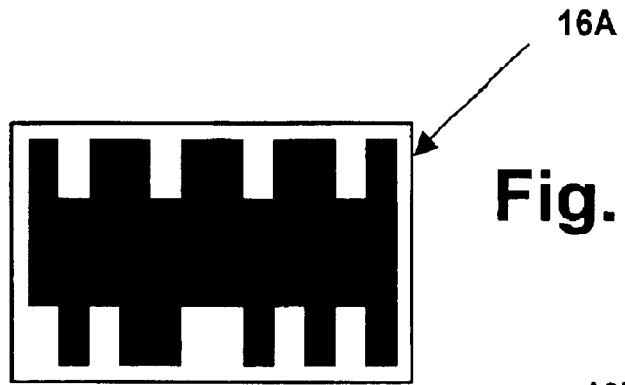
FIGS. 3A–3M are pictorial diagrams depicting metal patterns within the layers of the filter module of FIGS. 1A and 1B.
Figure 3B:
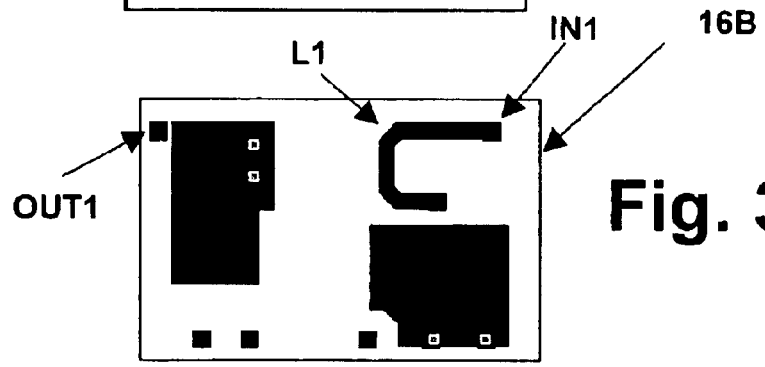
Figure 3C:
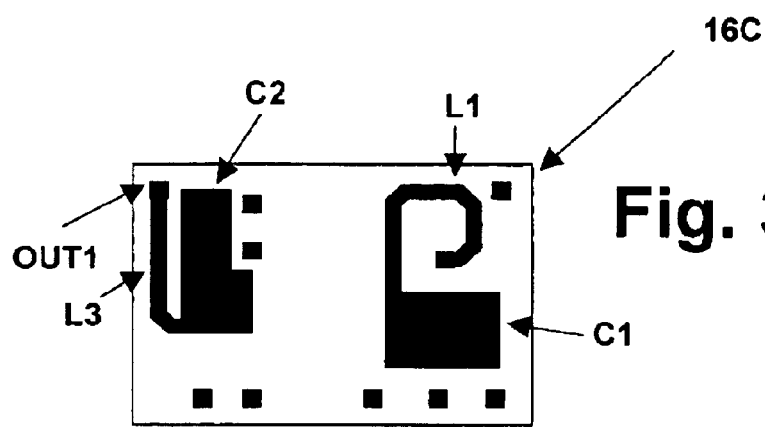
Figure 3D:
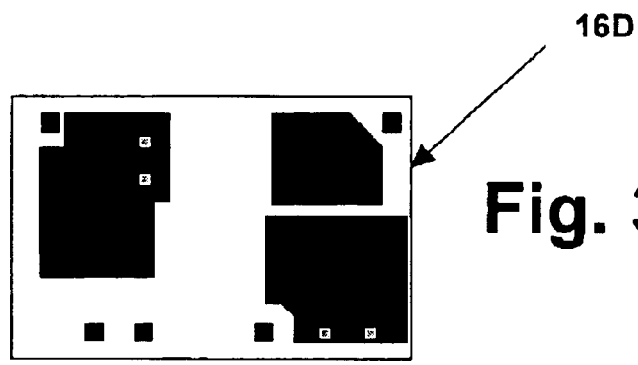
Figure 3E:
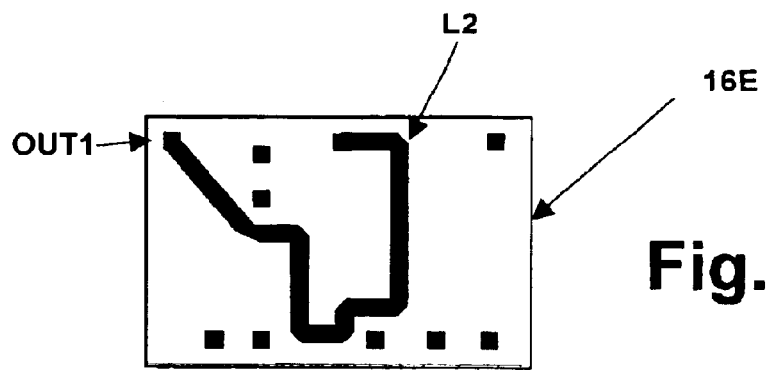
Figure 3F:
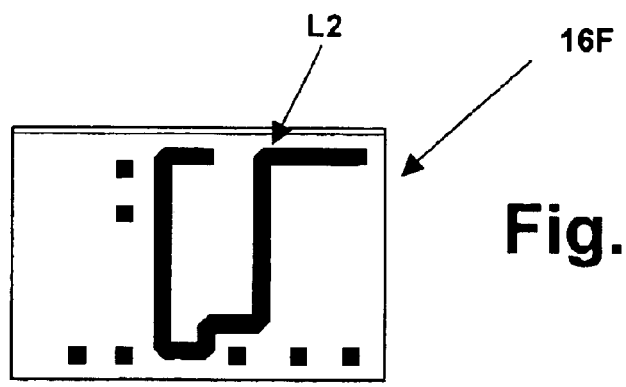
Figure 3G:
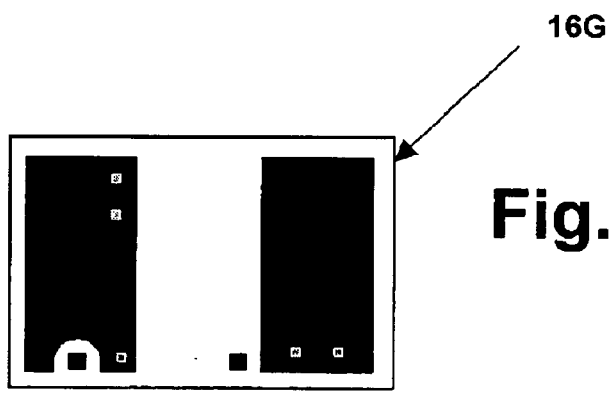
Figure 3H:
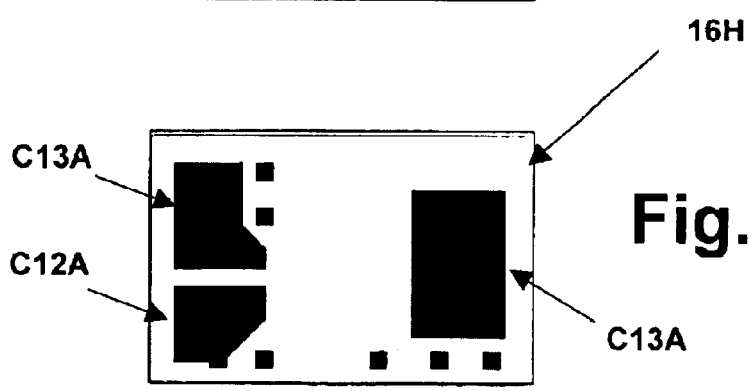

Referring now to FIGS. 3A–3M the specific metal circuit patterns implemented within layers 16 of filter 10 are depicted. Bottom layer 16A (depicted in FIG. 3A) is a metal layer used to isolate the circuits of filter 10 from external circuit traces or components beneath filter 10 in an installation. Gaps are provided to avoid capacitive loading on vias leading to external terminals 18 and the terminals themselves.

Layer 16B (depicted in FIG. 3B) includes a portion of inductor L1 coupled to input terminal IN1 and metal areas forming ground plates for capacitors C1 and C2. Layer 16C (depicted in FIG. 3C) includes the remainder of inductor L1 and the central plate of capacitor C1, positioned to the right side of the layers as shown. Inductor L3 and the central plate of capacitor C2 are positioned to the opposite side (corner) of layer 16C from inductor L1 and capacitor C1, providing isolation between the resonant circuits. Layer 16D (depicted in FIG. 3D)includes the other ground plates for capacitors C1 and C2 and a shield for inductor L1. Layer 16E (depicted in FIG. 3E) includes a first portion of inductor L2 connected to output terminal OUT1. Layer 16F (depicted in FIG. 3F) includes the remainder of inductor L2 connected to output terminal IN1.

Layer 16G (depicted in FIG. 3G) includes shield layers for isolation capacitors and other circuit elements between the two filter sections. Notably the central area is empty, as thin metal present between inductor stages will tend to increase coupling rather than reduce coupling, as induced currents in the metal would increase mutual coupling between adjacent inductors. Likewise layer 16H (depicted in FIG. 3H) has no metal in the central area, while implementing central plates for capacitors C12A (which forms a portion of capacitor C12), C13A (which forms a portion of capacitor C12), C11A (which forms a portion of capacitor C12) and metal shield sections.

Figure 3I:
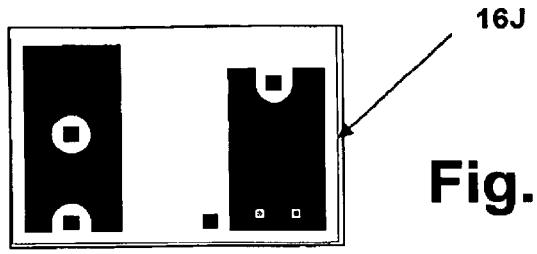
Figure 3J:
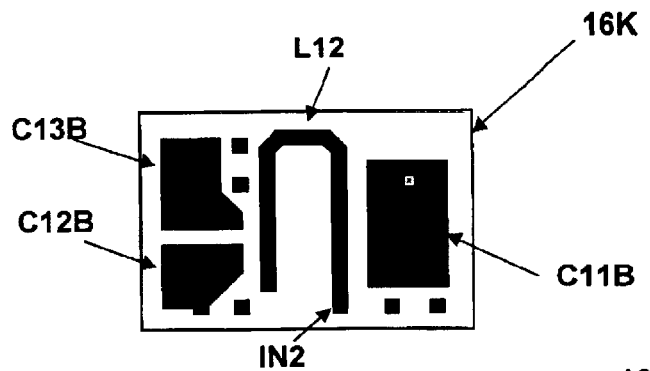

Layer 16J (depicted in FIG. 3I includes more metal shield sections (forming ground plates for capacitors C11, C12 and C13). Layers 16G–16J together provide an isolation distance between inductive couplers L2 and L12 of the two filter sections. Layer 16K (depicted in FIG. 3J) includes the central plates of capacitors C11, C12 and C13. (Capacitor plate 12B and capacitor plate 12A from layer 16H are connected in parallel to provide capacitor C12 of FIG. 2B, Capacitor plate 11B and capacitor plate 11A from layer 16H are connected in parallel to provide capacitor C11 of FIG. 2B and Capacitor plate 13B and capacitor plate 13A from layer 16H are connected in parallel to provide capacitor C13 of FIG. 28). Layer 16K also includes a portion of inductor L12 that is connected to input terminal IN2.

Figure 3K:
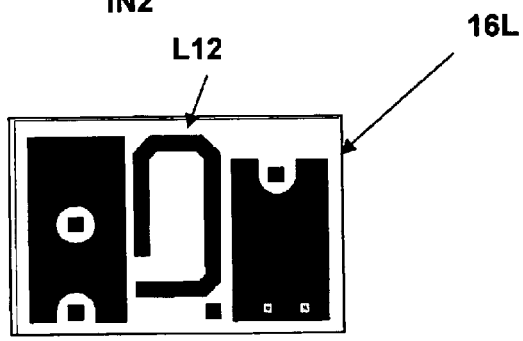
Figure 3L:
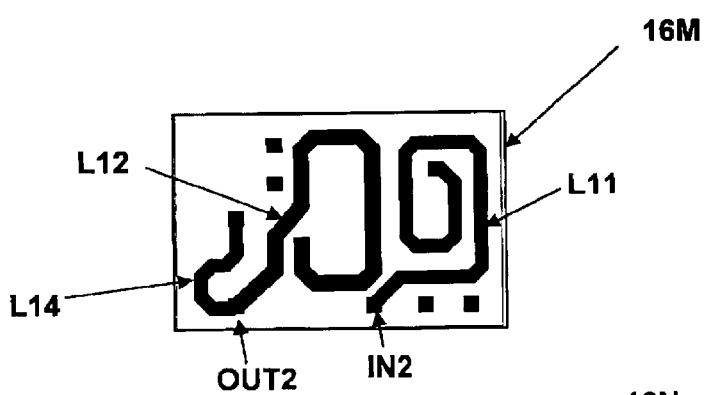
Figure 3M:
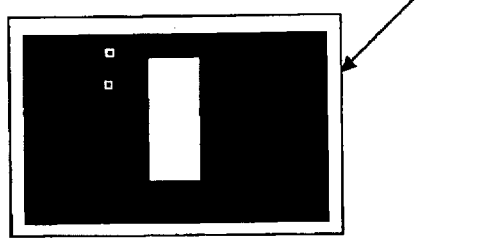

Layer 16L (depicted in FIG. 3K includes another section of inductor L12 and the third ground plates of capacitors C11, C12 and C13. Inductor L12 is connected to inductor L14 and output terminal OUT2 on layer 16M (depicted in FIG. 3L Layer 16M also includes inductor L11 connected to input IN2. Inductor L11 and capacitor C11 on layer 3K are positioned on the opposite side from the other components within the second filter stage, increasing isolation between the resonant circuits of the second filter stage.

Finally, layer 16N (depicted in FIG. 3M) provides a shield at the top of filter 10, excluding the central region that would degrade the operation of inductors (and increase coupling between the filter sections). In general, a metal layer, even if thick enough to prevent coupling to the inductors would increase filter insertion loss and reduce the Q of the resonators, degrading the operation of filter 10.

Figure 4:
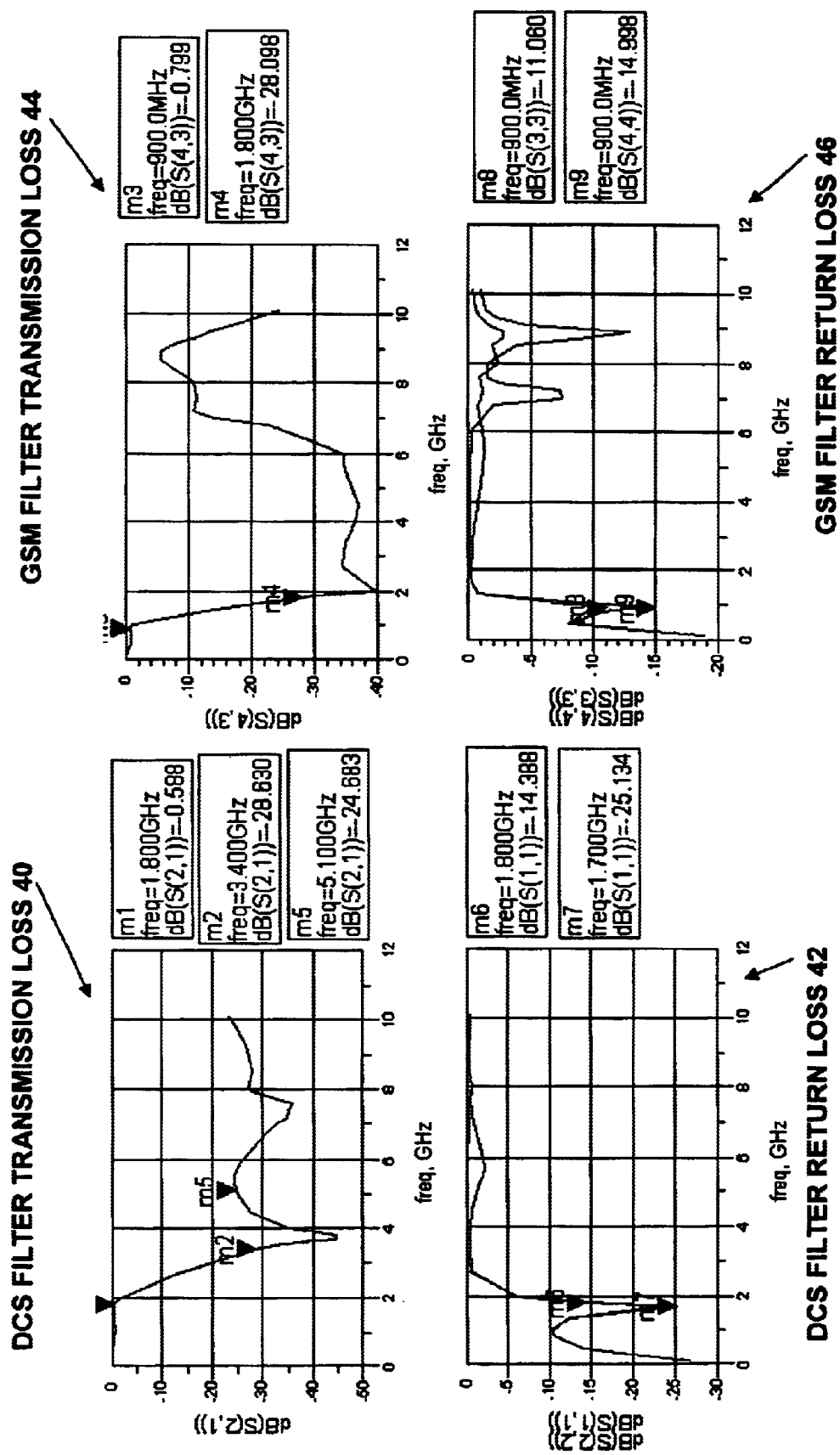
FIG. 4 is a set of graphs depicting the electrical operation of the filter module sections within the filter module of FIGS. 1A and 1B.

Referring now to FIG. 4, graphs depicting the operation of the filter sections of filter 10 are depicted. The DCS filter transmission loss 40 shows a rejection within the band of interest of greater than 25 dB, with even better rejection around the second harmonics of the in-band frequencies. The return loss 42 of the DCS section is shown as being better than −12 dB within the DCS transmit band. The transmission loss 44 of GSM filter is better than 30 dB out of band, extending past the third harmonic of in-band signals, and the return loss 46 is better than −10 dB for the in-band signals.

Figure 5A:
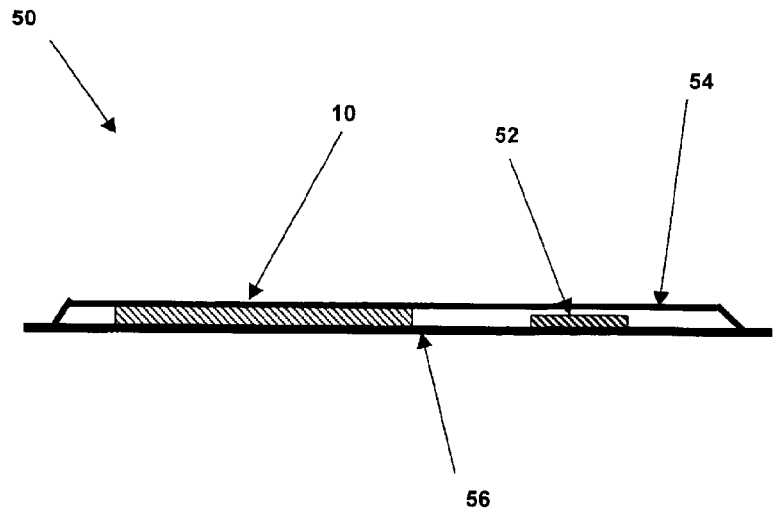
FIG. 5A is a pictorial diagram depicting a cross-section of a circuit module assembly incorporating the filter module of FIGS. 1A and 1B.
Figure 5B:
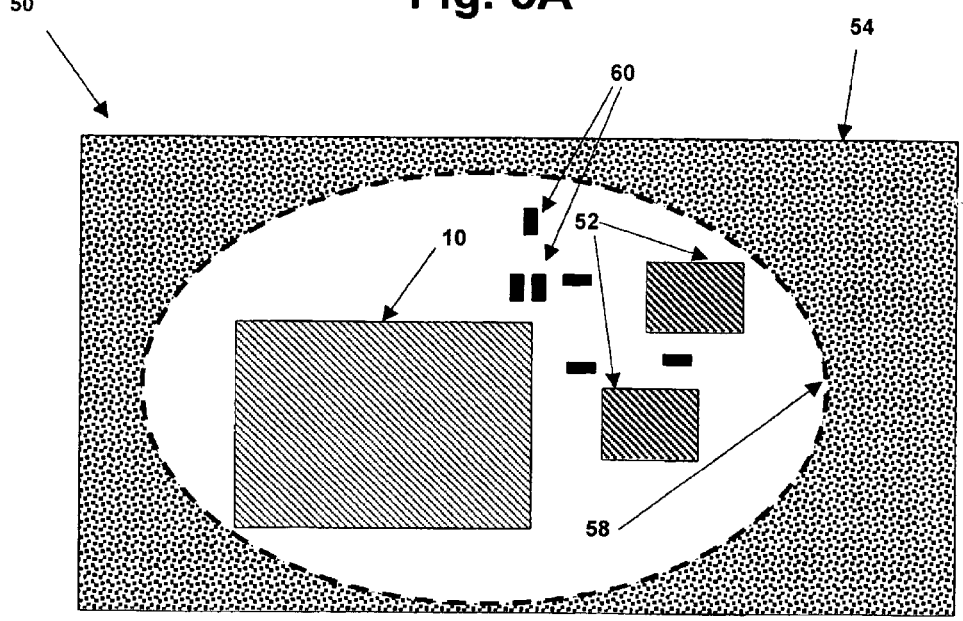
FIG. 5B is a pictorial diagram depicting a top view of the circuit module assembly of FIG. 5A.

Referring now to FIGS. 5A and 5B, a circuit module 50, in accordance with an embodiment of the present invention is depicted. Circuit module 50 is of a type having an overmold thickness 54 of approximately 1 mm. If standard filters were used, the filters would occupy approximately twice the area which filter 10 requires. Integrated circuits 52 and other components 60 are mounted on a substrate 56 and are shown in overmold 54 cut-away 58 that exposes the internal components of circuit module 50. Overmold 54 may be an injection-molded plastic resin or other suitable encapsulant or overmold 54 may be a thin cover attached by an adhesive.

The above description of embodiments of the invention is intended to be illustrative and not limiting. Other embodiments of this invention will be obvious to those skilled in the art in view of the above disclosure and fall within the scope of the present invention.

What is claimed is:

1. A dual filter module, comprising:
   a first filter section comprising a plurality of dielectric layers having first circuit patterns disposed thereon; and
   a second filter section comprising a second plurality of dielectric layers having second circuit patterns disposed thereon, and wherein a last one of the first plurality of dielectric layers is adjacent to a first one of the second plurality of dielectric layers, and wherein a first inductor of the first filter section and a second inductor of the second filter section are isolated from each other by locating the first inductor proximate a first layer of the first plurality of dielectric layers and the second inductor proximate the last layer of the second plurality of dielectric layers, whereby coupling between the first and second inductors is reduced.

2. The dual filter module of claim 1, wherein the first and second filter sections are transmit band filters for removing spurious components from a multi-band transceiver output.

3. The dual filter module of claim 2, wherein the first filter section is a Groupe Spécial Mobile (GSM) transmit filter.

4. The dual filter module of claim 3, wherein the second filter section is a Digital Cellular System (DCS) transmit filter.

5. The dual filter module of claim 1, wherein each of the filter sections comprises:

a first capacitor and a shunt inductor coupled in functional series from an input of the filter section to ground; and a series inductor coupled from the input to an output of the filter section.

6. The dual filter module of claim 5, wherein the first capacitor and the second capacitor of each filter section each include a terminal connected to ground.

7. The dual filter module of claim 5, wherein the second filter section further comprises a third capacitor and a third inductor coupled in functional series from the output of the filter section to ground.

8. The dual filter module of claim 1, wherein the first inductor is an inductive coupler.

9. The dual filter module of claim 8, wherein the second inductor is an inductive coupler.

10. The dual filter module of claim 1, wherein the first inductor and the second inductor are series inductors connected in functional series between an input and an output of their respective filter section and wherein the first circuit patterns and the second circuit patterns located on internal layers of the first and second plurality of dielectric layers are formed such that conductive planes are absent from the areas occupied by circuit patterns forming the series inductors throughout the internal layers, whereby resistive loss in the series inductors is reduced.

11. The dual filter module of claim 1, wherein the first filter section includes a first resonator and the second filter section includes a second resonator, and wherein the first resonator is located substantially toward a first corner of the dual filter module and the second resonator is located substantially toward an opposing corner of the dual filter module.

12. The dual filter module of claim 1, wherein dielectric layers within the first and second plurality of dielectric layers that include capacitors have a thickness substantially less than other dielectric layers within the first and second plurality of dielectric layers.

13. The dual filter module of claim 1, wherein dielectric layers within the first and second plurality of dielectric layers that include capacitors have a dielectric constant substantially higher than other dielectric layers within the first and second plurality of dielectric layers.

14. The dual filter module of claim 1, wherein the first filter section and the second filter section include electrically isolated input and output terminals disposed on an exterior surface of the dual filter module.

15. The dual filter module of claim 1, wherein the first filter section and the second filter section are electrically connected in cascade, and wherein an input of the first filter section and an output of the second filter section are provided by terminals on an exterior surface of the dual filter module.

16. The dual filter module of claim 1, wherein the first plurality of dielectric layers and the second plurality of dielectric layers comprise layers of ceramic tape.

17. A dual filter module, comprising:

a first radio-frequency filter integrated within a first plurality of dielectric layers of the filter module; and a second radio-frequency filter integrated within a second plurality of dielectric layers of the filter module, and wherein said first and second radio-frequency filters each include a series inductor and means for isolating the series inductor of the first radio-frequency filter from the series inductor of the second radio-frequency filter, wherein the means for isolating isolates the series inductors from each other by locating the first inductor proximate a first layer of the first plurality of dielectric layers and the second inductor proximate the last layer of the second plurality of dielectric layers, whereby coupling between the first and second inductors is reduced.

18. The dual filter module of claim 17, further comprising means for reducing resistive losses in the series inductors.

19. The dual filter module of claim 17, wherein the first filter means includes first coupling means for coupling an input section of the first filter means to an output section of the first filter means, and wherein the second filter means includes second coupling means for coupling an input section of the second filter means to an output section of the second filter means.

20. The dual filter module of claim 17, wherein the first filter means and the second filter means are connected in cascade for performing a single filtering function.

21. The dual filter module of claim 17, wherein the first plurality of dielectric layers and the second plurality of dielectric layers comprise layers of ceramic tape.

22. The dual filter module of claim 17, wherein layers within the first and second plurality of dielectric layers that include capacitors have a dielectric constant substantially higher than other dielectric layers within the first and second plurality of dielectric layers.

23. The dual filter module of claim 17 wherein dielectric layers within the first and second plurality of dielectric layers that include capacitors have a thickness substantially less than other dielectric layers within the first and second plurality of dielectric layers.

* * * * *